(12) United States Patent
Van Buel

(10) Patent No.: US 7,094,506 B2
(45) Date of Patent: Aug. 22, 2006

(54) LITHOGRAPHIC APPARATUS AND DEVICE MANUFACTURING METHOD

(75) Inventor: Henricus Wilhelmus Maria Van Buel, Eindhoven (NL)

(73) Assignee: ASML Netherlands B.V, Veldhoven (NL)

( * ) Notice: Subject to any disclaimer, the term of this patent is extended or adjusted under 35 U.S.C. 154(b) by 150 days.

(21) Appl. No.: 10/795,801

(22) Filed: Mar. 9, 2004

(65) Prior Publication Data

US 2005/0200819 A1    Sep. 15, 2005

(51) Int. Cl.
*G03B 27/54* (2006.01)

(52) U.S. Cl. .......................... 430/5; 430/322; 355/67; 355/77

(58) Field of Classification Search .................. None
See application file for complete search history.

(56) References Cited

U.S. PATENT DOCUMENTS

| 5,229,872 A | 7/1993 | Mumola |
| 5,296,891 A | 3/1994 | Vogt et al. |
| 5,500,736 A | 3/1996 | Koitabashi et al. |
| 5,523,193 A | 6/1996 | Nelson |
| 5,530,482 A | 6/1996 | Gove et al. |
| 5,579,147 A | 11/1996 | Mori et al. |
| 5,677,703 A | 10/1997 | Bhuva et al. |
| 5,808,797 A | 9/1998 | Bloom et al. |
| 5,982,553 A | 11/1999 | Bloom et al. |
| 6,133,986 A | 10/2000 | Johnson |
| 6,177,980 B1 | 1/2001 | Johnson |
| 6,448,568 B1 | 9/2002 | Allen et al. |
| 6,687,041 B1 | 2/2004 | Sandstrom |
| 6,747,783 B1 | 6/2004 | Sandstrom |
| 6,795,169 B1 | 9/2004 | Tanaka et al. |
| 6,806,897 B1 | 10/2004 | Kataoka et al. |
| 6,811,953 B1 | 11/2004 | Hatada et al. |
| 2003/0030781 A1 | 2/2003 | Bleeker et al. |
| 2003/0086177 A1 | 5/2003 | Kowarz et al. |
| 2004/0041104 A1 | 3/2004 | Liebregts et al. |
| 2004/0130561 A1 | 7/2004 | Jain |

FOREIGN PATENT DOCUMENTS

| EP | 1 316 850 A1 | 6/2003 |
| EP | 1 482 375 A2 | 12/2004 |
| WO | WO 98/33096 | 7/1998 |
| WO | WO 98/38597 | 9/1998 |

OTHER PUBLICATIONS

European Search Report from European Patent Appl. No. 05251014.6, 3 pages, dated May 6, 2005.

*Primary Examiner*—John A. McPherson
*Assistant Examiner*—Daborah Chacko-Davis
(74) *Attorney, Agent, or Firm*—Sterne, Kessler, Goldstein & Fox P.L.L.C.

(57) ABSTRACT

A lithographic apparatus has a plurality of patterning arrays (e.g., 2, 4, etc.), which are spaced apart in an object plane. A combined, overlapped image of the patterning arrays is projected onto the substrate. Because the image is formed from radiation produced from spaced apart patterning arrays, the image arrives from different angles and has a higher effective numerical aperture (NA).

11 Claims, 1 Drawing Sheet

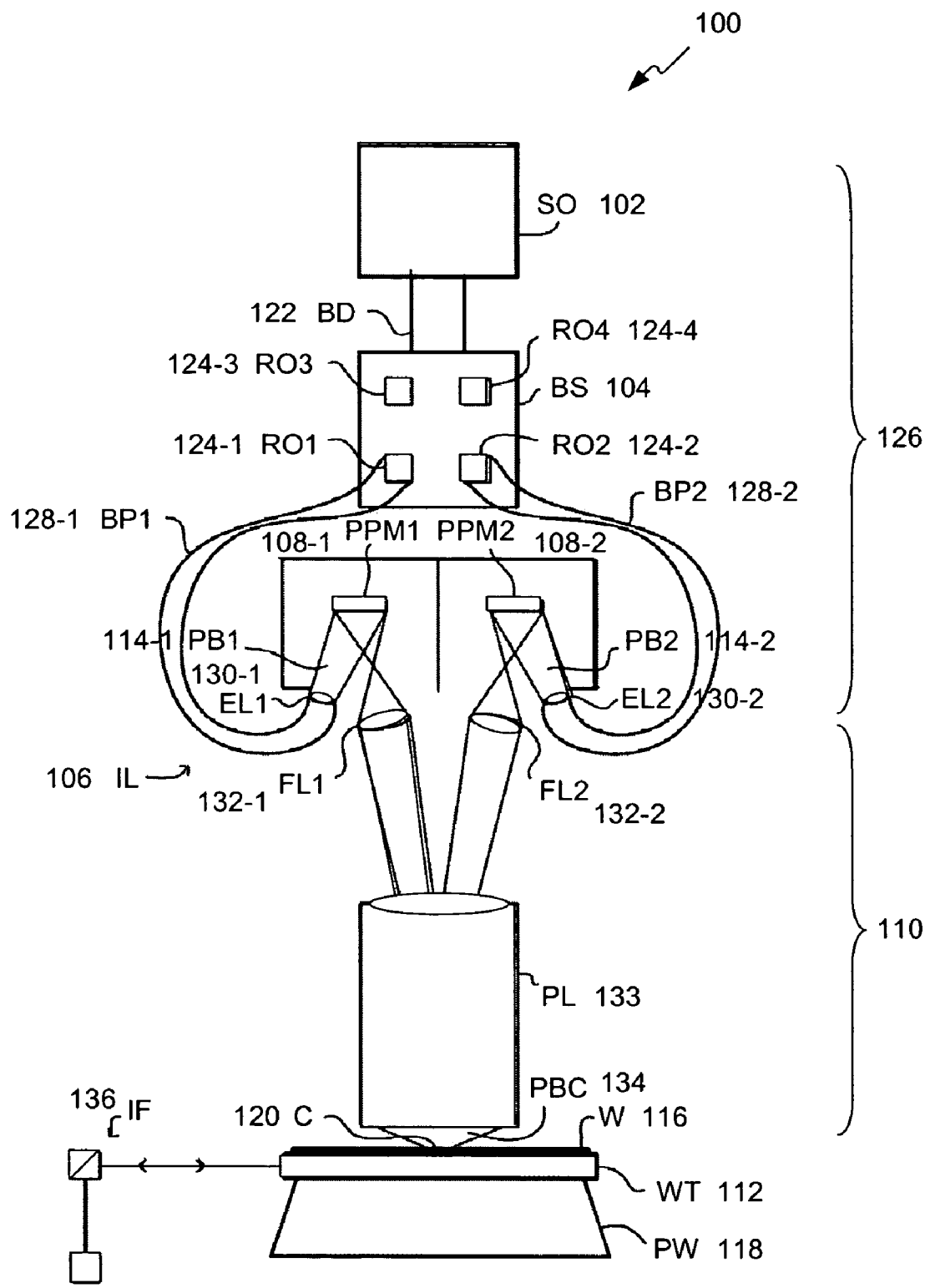
FIG.

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving forming fine structures. In a conventional lithographic apparatus, a patterning means, which is alternatively referred to as a mask or a reticule, may be used to generate a circuit pattern corresponding to an individual layer of the IC (or other device), and this pattern can be imaged onto a target portion (e.g., part of one or several dies) on a substrate (e.g., a silicon wafer, glass plate, etc.) That has a layer of radiation-sensitive material (e.g., resist, photoresists, etc.). Instead of a mask, the patterning means may be dynamic and include an array of individually controllable elements, which serve to generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the projection beam in a given direction (the "scanning"-direction), while synchronously scanning the substrate parallel or anti-parallel to this direction.

Because of the high capital costs of masks used in conventional lithographic apparatus, various proposals have been made to replace the mask by a programmable device, such as a liquid crystal display, a micro-mirror array, a grating light valve, or the like. A mask pattern is digitally loaded into the programmable device, which spatially modulates the projection beam so that a desired pattern is projected onto the substrate. This enables smaller production runs of a given pattern to be produced economically and allows one or more changes to the pattern to be made dynamically or in real-time, which reduce the prototyping cycle. Suitable programmable devices, also referred to as spatial light modulators, programmable patterning devices, dynamic pattern generators, or the like, have the drawback that they emit quite narrow beams, i.e., with a low NA, whereas a high NA is desirable to increase the resolution of the projected image.

Therefore, what is needed is a system and method that provide a lithographic apparatus employing a programmable patterning means that also has a high effective NA at a substrate plane.

SUMMARY OF THE INVENTION

An embodiment of the present invention provides a lithographic apparatus including an illumination system for supplying a plurality of sub-beams of radiation, a plurality of patterning arrays of individually controllable elements, each patterning array serving to endow a respective sub-beam with a pattern, the patterning means being spaced apart in an object plane, a substrate table for supporting a substrate, and a projection system for projecting the patterned sub-beams to overlap and form a combined image on a target portion of the substrate. Because the combined image on the substrate is formed by radiation from a plurality of patterning arrays that are spaced apart in an object plane, the radiation arrives at the substrate from a wider range of angles than if the image were formed from a single patterning array and hence has a higher effective NA. This can improve resolution.

Preferably, two or four patterning arrays are provided. Using two arrays provides an effect comparable to dipole illumination. Dipole illumination can be useful for patterns mainly having lines extending in one direction (e.g., raster arrays or certain layers in memory chips). Using four arrays provide an effect comparable to quadruple illumination, which is better for patterns with lines extending in two directions or with dots.

Preferably, the projection system includes a plurality of field lens systems corresponding in number to the patterning arrays and a common part. The field lens systems form images of their respective patterning arrays in a pupil plane of the common part. The projection system may have an overall magnification of from about ½ to about ¼ or about ⅕.

Also preferably, the plurality of sub-beams are derived from a single radiation source. This can enable interference between the overlapped images to improve imaging, which can be further improved by the provision of phase adjustors in the paths of the separate sub-beams.

In a preferred embodiment of the invention, the illumination system includes light guides (e.g., liquid light guides) to conduct the sub-beams to their respective patterning arrays. The liquid light guides can provide a flexible means of conducting the light to the patterning arrays with low losses. A fixed light train employing beam directing mirrors may also be used.

Another embodiment of the present invention provides a device manufacturing method comprising the steps of providing a substrate, providing a plurality of sub-beams of radiation using an illumination system, using a plurality of patterning arrays of individually controllable elements to impart respective ones of said sub-beams with a pattern, and projecting the patterned sub-beams of radiation to overlap and form a combined image on a target portion of the substrate.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The FIGURE depicts a lithographic apparatus according to an embodiment of the invention.

The present invention will now be described with reference to the accompanying drawings. In the drawings, like reference numbers may indicate identical or functionally similar elements.

DETAILED DESCRIPTION OF THE INVENTION

Overview and Terminology

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array may comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described hereabove, the array of individually controllable elements can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as, for example, the manufacture of DNA chips, MEMS, MOEMS, integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5–20 nm), as well as particle beams, such as ion beams or electron beams.

The term "projection system" used herein should be broadly interpreted as encompassing various types of projection system, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (e.g., dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index (e.g., water), so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Further, the apparatus may be provided with a fluid processing cell to allow interactions between a fluid and irradiated parts of the substrate (e.g., to selectively attach chemicals to the substrate or to selectively modify the surface structure of the substrate).

Exemplary Systems

The FIGURE schematically depicts a lithographic projection apparatus 100 according to an embodiment of the present invention. The apparatus 100 includes a radiation source 102, a beam splitter 104, an illumination system 106, a plurality of patterning arrays of individually controllable elements 108-1, 108-2, . . . , 108-n (n=1, 2, . . . ), a projection system 110, and a substrate table 112.

Illumination system IL 106 (e.g., illuminator) provides a projection beam in the form of a plurality of sub-beams 114-1 PB1, 114-2 PB2 of radiation (e.g., UV radiation). Plurality of patterning arrays of individually controllable elements 108-n PPM1, PPM2 (e.g., a programmable mirror array) apply a pattern to the projection beam. Substrate table 112 WT (e.g., a wafer table) supports a substrate 116 W (e.g., a resist-coated wafer) and is connected to positioning means 118 PW to accurately position the substrate 116 with respect to the projection system 110. Projection system 110 (e.g., one or more lenses) image a pattern imparted to the projection beam by the array of individually controllable elements 108 PPM onto a target portion 120 C (e.g., one or more dies) of the substrate 116 W. The projection system 110 images the array of individually controllable elements 108 onto the substrate 116 with a magnification (e.g., about ¼, about ⅕, or similar magnification).

The number of sub-beams 114-1 PB1, 114-2 PB2 of the projection beam corresponds to the number of arrays of patterning elements 108-1 PPM 1, 108-2 PPM2 and may, for example, be 2 or 4. Merely for ease of discussion, only two sub-beams 114 and two patterning arrays 108 are shown in the FIGURE. It is to be appreciated any number if either can be used, and all variations are contemplated within the scope of the present invention.

Illuminator 106 IL includes beam splitter 104 BS that receives a beam of radiation through beam delivery system 122 BD (e.g., air, optical elements, waveguides, etc.) from radiation source 102 SO and forms plurality of sub-beams at respective radiation outlets 124-n (n=1, 2, . . . ), for example 124-1 to 124-4 RO1-RO4.

In one embodiment, the source 102 and the lithographic apparatus 100 may be separate entities, for example when the source 102 is an excimer laser. In this embodiment, the source 102 is not considered to form part of the lithographic apparatus 100 and the radiation beam is passed from the source 102 SO to the illuminator 106 IL with the aid of beam delivery system 122 BD, which can include, for example, suitable directing mirrors and/or a beam expander.

In another embodiment, the source 102 may be integral part of the apparatus 100, for example when the source 102 is a mercury lamp. The source 102 SO and the illuminator 106 IL, together with the beam delivery system 122 BD (if required), may be referred to as a radiation system 126.

In an exemplary application, a suitable source and beam splitter BS are the source part, up to and including the beam splitting means, of the optical exposure apparatus described in U.S. Pat. No. 6,618,118 to Minnaert et al., which is hereby incorporated by reference in its entirety.

The illuminator 106 further comprises a beam pipe 128-n (n=1, 2, . . . ), for example 128-1 and 128-2 BP1, BP2 for each sub-beam to take the radiation of the respective sub-beam and direct it onto one of the patterning arrays 108-1, 108-2 PPM1, PPM2, which may be micro-mirror arrays or grating light valve arrays, for example. An exit lens 130-n (n=1, 2, . . . ), for example 130-1, 130-2 EL1, EL2 collimates the beam directed onto the patterning arrays 108-1, 108-2 PPM1, PPM2. In various embodiments, beam pipes 128 can be glass, fiber optics, suitably angled mirrors, liquid light guides, or the like. For example, an exemplary beam pipe is described in U.S. Pat. No. 6,618,118, referenced above.

The illuminator IL 106 may further include an adjusting system (not shown) to adjust the angular intensity distribution of the beam. In one embodiment, at least the outer and/or inner radial extent (commonly referred to as σ-outer and σ-inner, respectively) of the intensity distribution in a pupil plane of the illuminator can be adjusted.

It is to be appreciated that illuminator 106 IL may include various other components, such as an integrator and a condenser. The illuminator 106 can provide conditioned beams of radiation, referred to as the projection sub-beams 114-1, 114-2 PB1, PB2, having a desired uniformity and intensity distribution in their cross-sections.

Each sub-beam 114-1, 114-2 PB1, PB2 subsequently interacts with a respective patterning array 108-1, 108-2 PPM1, PPM2. Having been reflected by the array of individually controllable elements 108 PPM, the beam 114 PB is directed into the projection system 110. The projection system 110 has two parts or portions, one being a common portion. The projection system 110 focuses the beam 114 PB onto a target portion 120 C of the substrate 116 W, by field lenses 132-n (n=1, 2, . . . ) (e.g., a first part or portion), for example 132-1, 132-3 FL1, FL2, one of which is provided for each patterning array. The filed lenses 132, which may be a simple lens or more complex optical system, project images of their respective patterning arrays 108 onto a pupil plane of a projection lens 133 PL (e.g., a second part or portion or a common part or portion). In one embodiment, the projection lens 133 PL corresponds essentially to half of a conventional projection lens, from the pupil plane onwards.

In this embodiment, the patterning arrays 108 are programmed with the same pattern and their images in the pupil plane are arranged to overlap, such that a combined image is projected onto the substrate 116. Because of the different positions of the patterning arrays 108-1, 10802 PPM1, PPM2, the radiation in the pupil plane arrives from the different patterning arrays 108 from different directions.

Therefore, according to this embodiment of the present invention, light arrives at the substrate 116 from a wider range of angles in spite of the fact that the beams from the patterning arrays 108 are necessarily very narrow. Thus, the combined projection beam 134 PBC at the substrate 116 effectively has a high NA, which is essential for fine imaging.

In one embodiment, phase adjustment can be provided in the illumination system 106 or after the patterning arrays 108 to optimize interference between the different sub-beams 114 in the combined beam for imaging 134.

In one embodiment, adjustments to the patterns on each patterning array 108 may be made to improve imaging. The patterning arrays 108 and/or the field lenses 132 may be provided with positioning devices (not shown) to adjust their positions, and hence the positions of the overlapped images (e.g., for correct alignment).

If a larger image field is desired, in one embodiment multiple optical engines, each comprising a set of PPMs 108 and a projection system 110 for imaging the PPMs 108 in an overlapping combined image, may be provided to project additional images side-by-side on the substrate 116 in parallel.

With the aid of the positioning means 118 PW and, optionally, an interferometric measuring means 136 IF, the substrate table 112 WT can be moved accurately (e.g., to position different target portions 120 C in the path of the beam 114 PB). Where used, the positioning means for the array of individually controllable elements 108 can be used to accurately correct the position of the array of individually controllable elements 108 PPM with respect to the path of the beam 114 PB (e.g., during a scan).

Movement of the substrate table 114 WT can be realized with the aid of a long-stroke module (course positioning) (not shown) and a short-stroke module (fine positioning) (not shown). A similar system may also be used to position the array of individually controllable elements 108.

It will be appreciated that the projection beam 114 may alternatively, or in addition, be moveable while an object table (not shown) and/or the array of individually controllable elements 108 may have a fixed position to provide the required relative movement.

As a further alternative, which may be especially applicable in the manufacture of flat panel displays, the position of the substrate table 112 and the projection system 110 may be fixed and the substrate 116 may be arranged to be moved relative to the substrate table 112. For example, the substrate table 112 may be provided with a system (not shown) for scanning the substrate 116 across it at a substantially constant velocity.

Exemplary Environments

In various embodiments of the present invention, the apparatus 100 can be used in four preferred modes: step, scan, pulse, and continue scan, discussed below.

In step mode, the array of individually controllable elements 108 imparts an entire pattern to the projection beam 134, which is projected onto a target portion 120 C during a single static exposure. The substrate table 116 WT is then shifted in the X and/or Y direction so that a different target portion 120 C can be exposed. The maximum size of the exposure field limits the size of the target portion 120 C imaged in a single static exposure.

In scan mode, the array of individually controllable elements 108 is movable in a given direction (the "scan direction", e.g., the Y direction) with a speed V, so that the projection beam 114 PB is caused to scan over the array of individually controllable elements 108. Concurrently, the substrate table 112 WT is simultaneously moved in the same or opposite direction at a speed V=Mv, in which M is the magnification of the projection system 110. The maximum size of the exposure field limits the width (in the non-scanning direction) of the target portion 120 in a single dynamic exposure, whereas the length of the scanning motion determines the height (in the scanning direction) of the target portion 120.

In pulse mode, the array of individually controllable elements 108 is kept essentially stationary and the entire pattern is projected onto a target portion 120 C of the substrate 116 using a pulsed radiation source for source 102. The substrate table 112 WT is moved with an essentially constant speed, such that the projection beam 114 PB is caused to scan a line across the substrate W 116. The pattern on the array of individually controllable elements 108 is updated as required between pulses of the radiation system 102 and the pulses are timed such that successive target portions 120 C are exposed at the required locations on the substrate 116. Consequently, the combined projection beam 134 can scan across the substrate W 116 to expose the complete pattern for a strip of the substrate 116. The process is repeated until the complete substrate 116 has been exposed line by line.

Continuous scan mode is essentially the same as pulse mode except that a substantially constant radiation source can be used for source 102 and the pattern on the array of individually controllable elements 108 is updated as the combined projection beam 134 scans across and exposes the substrate 116.

Combinations and/or variations on the above described modes of use or entirely different modes of use may also be employed.

As here depicted, the apparatus 100 is of a reflective type (i.e., has a reflective array of individually controllable elements 108). However, in general, it may also be of a transmissive type, for example (i.e., with a transmissive array of individually controllable elements, for example an LCD pattern generator).

The position of the array of individually controllable elements 108 can be fixed relative to the projection system PL 110. However, the array of individually controllable elements 108 may instead be connected to a positioning device (not shown) for accurately positioning it with respect to the projection system 110.

Although the lithography apparatus 100 according to the invention is herein described as being for exposing a resist on a substrate, it will be appreciated that the invention is not limited to this use and the apparatus may be used to project a patterned projection beam for use in resistless lithography.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A lithographic apparatus, comprising:
an illumination system that produces a plurality of sub-beams of radiation;
a plurality of patterning arrays of individually controllable elements arranged in different predetermined positions in an object plane, wherein each patterning array patterns a respective sub-beam with a pattern; and
a projection system that projects the patterned sub-beams onto a substrate, such that the patterned sub-beams overlap to form a combined image on a target portion of the substrates,
wherein, based on the patterning arrays being arranged in different predetermined positions in the object plane, respective sub-beams arrive at different angles at a pupil plane, such that the combined image has a high numerical aperture.

2. The apparatus according to claim 1, wherein the projection system comprises:
a plurality of field lens systems corresponding in number to the patterning arrays; and
a common part, whereby the field lens systems form images of their respective patterning arrays in a pupil plane of the common part.

3. The apparatus according to claim 2, wherein said projection system has an overall magnification of from about ½ to about ⅕.

4. The apparatus according to claim 1, wherein said illumination system comprises a single radiation source from which the plurality of sub-beams are derived.

5. The apparatus according to claim 4, wherein said illumination system further comprises phase adjustors in the paths of the separate sub-beams.

6. The apparatus according to claim 1, wherein said illumination system comprises light guides that guide the sub-beams to their respective patterning arrays.

7. The apparatus according to claim 1, wherein said illumination system comprises an optical system including one or more beam directing mirrors.

8. The apparatus according to claim 1, wherein the plurality of patterning arrays comprises two patterning arrays.

9. The apparatus according to claim 1, wherein the plurality of patterning arrays comprises four patterning arrays.

10. A device manufacturing method, comprising:
   producing a plurality of sub-beams of radiation using an illumination system;
   positioning each patterning array of individually controllable elements in a plurality of patterning arrays of individually controllable elements at a different predetermined position in an object plane;
   imparting respective ones of said sub-beams with a pattern using the plurality of patterning arrays of individually controllable elements, such that each of the patterned sub-beams arrives at a pupil plane from a different angle; and
   projecting the patterned sub-beams of radiation onto a substrate, such that the patterned sub-beams overlap to form a combined image having a high numerical aperture on a target portion of the substrate.

11. A method, comprising:
   patterning individual beams of radiation generated from an illumination source using a respective individual patterning array in a plurality of patterning arrays of individually controllable elements, the patterning arrays being located at different predetermined positions in an object plane, such that each of the patterned sub-beams arrives at a pupil plane from a different angle; and
   overlapping the individual patterned beams to form a combined image on a target portion of a substrate, so that the combined image has a higher effective numerical aperture.

* * * * *